(12) United States Patent
Son

(10) Patent No.: US 7,916,056 B2
(45) Date of Patent: Mar. 29, 2011

(54) SIGMA DELTA MODULATOR AND SIGMA DELTA A/D CONVERTER USING THE SAME

(75) Inventor: Ju-ho Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 22 days.

(21) Appl. No.: 12/468,091

(22) Filed: May 19, 2009

(65) Prior Publication Data

US 2010/0085230 A1 Apr. 8, 2010

(30) Foreign Application Priority Data

Oct. 8, 2008 (KR) .......................... 10-2008-0098632

(51) Int. Cl.
*H03M 3/00* (2006.01)
(52) U.S. Cl. ........................................ 341/143; 341/155
(58) Field of Classification Search .................. 341/118, 341/120, 155, 143
See application file for complete search history.

(56) References Cited

U.S. PATENT DOCUMENTS

| 5,757,300 A | * | 5/1998 | Koilpillai et al. | ............. 341/143 |
| 5,894,468 A | * | 4/1999 | Kimura et al. | .................. 360/46 |
| 5,907,299 A | * | 5/1999 | Green et al. | ................... 341/143 |

* cited by examiner

*Primary Examiner* — Brian Young
(74) *Attorney, Agent, or Firm* — Sughrue Mion, PLLC

(57) ABSTRACT

A sigma-delta modulator is provided. The sigma-delta modulator includes a differential amplifier which outputs a difference signal indicating a difference between an input analog signal and a feedback input analog signal, an integrator which integrates the difference signal, a band pass filter unit connected to the integrator in parallel which performs band pass filtering with respect to the difference signal, an adder which adds the band-pass filtered signal to the integrated signal, a comparator which compares a signal output from the adder with a predetermined reference value, converts the comparison result into a digital signal, and outputs the digital signal; and a digital-to-analog (D/A) which converts the digital signal output from the comparator into an analog signal and feeds the analog signal back to the differential amplifier.

10 Claims, 9 Drawing Sheets

SIGMA DELTA MODULATOR AND SIGMA DELTA A/D CONVERTER USING THE SAME

CROSS-REFERENCE TO RELATED APPLICATIONS

This application claims priority from Korean Patent Application No. 10-2008-98632, filed on Oct. 8, 2008, in the Korean Intellectual Property Office, the entire disclosure of which is incorporated herein by reference in its entirety.

BACKGROUND OF THE INVENTION

1. Field of the Invention

Apparatuses and methods consistent with the present invention relate to a sigma-delta modulator and an analog-to-digital (A/D) converter using the same, and more particularly, to a sigma-delta modulator capable of reducing quantization noise and an A/D converter using the same.

2. Description of the Related Art

Most of the signals in the natural world continuously change with time. In order to understand a phenomenon in the natural world, it is necessary to measure analog signals that continuously change with time. Also, the measured values may be processed and analyzed through a computer. In order to process and analyze the analog signals through a computer, a device is required for converting the analog signals into digital values which can be processed by the computer. Such a device is called an analog-to-digital (A/D) converter.

Among A/D converters, a sigma-delta A/D converter has been widely used for its advantages of high definition and a high level of circuit integration achieved at low cost.

The sigma-delta A/D converter and a sigma-delta modulator included in the sigma-delta A/D converter calculate a digital signal as a final output using an oversampling technique.

However, the oversampling technique may cause quantization noise in addition to generation of a desired signal. The quantization noise has a tendency to gradually increase as a frequency increases.

In discriminating and detecting a desired signal component from quantization noise, a small average noise floor of the quantization noise is more advantageous.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a sigma-delta modulator capable of reducing an average quantization noise floor by performing band pass filtering, and a sigma-delta A/D converter using the same.

Consistent with an aspect of the present invention, a sigma-delta modulator may include a differential amplifier which outputs a difference signal indicating a difference between an input analog signal and a feedback input analog signal, an integrator which integrates the difference signal, a band pass filter unit connected to the integrator in parallel which performs band pass filtering with respect to the difference signal, an adder which adds the band-pass filtered signal to the integrated signal, a comparator which compares a signal output from the adder with a predetermined reference value, converts the comparison result into a digital signal, and outputs the digital signal, and a D/A converter which converts the digital signal output from the comparator into an analog signal and feeds the analog signal back to the differential amplifier.

The band pass filter unit may include at least one band pass filter.

The sigma-delta modulator may further include a DWA unit which corrects the digital signal output from the comparator to prevent an error from occurring in the D/A converter; and a delay compensator which is connected to the DWA unit, and receives the signal output from the DWA unit to compensate for a delay between the input signal and the feedback input signal and provides the compensated signals to the D/A converter and the adder.

The band pass filter unit may include a first integrator and a second integrator which are connected to each other in series and integrate input signals respectively, a multiplier which adjusts a gain of the signal output from the second integrator by multiplying the signal by a predetermined coefficient, and an adder which adds the gain-adjusted signal fed back thereto to the input signal.

The comparator may cause quantization noise to occur during the process that the signal output from the adder is converted into a digital signal, and the quantization noise included in the signal output from the comparator may be divided into a first low frequency domain and a second high frequency domain at a predetermined frequency, and the number of notches formed in the first domain may increase in proportion to the number of band pass filters of the band pass filter unit.

As the number of band pass filters of the band pass filter unit increases, a corresponding notch may be formed in a low frequency direction in the first domain and a depth of the notch may gradually decrease.

Consistent with an aspect of the present invention, a sigma-delta A/D converter may include a sigma-delta modulator, a digital filter, and a decimation filter, and the sigma-delta modulator comprises a differential amplifier which outputs a difference signal indicating a difference between an input analog signal and a feedback input analog signal, an integrator which integrates the calculated signal, a band pass filter unit connected to the integrator in parallel which performs a band pass filtering with respect to the difference signal, an adder which adds the band-pass-filtered signal to the integrated signal, a comparator which compares the signal output from the adder with a predetermined reference value and converts the comparison result into a digital signal, and a digital-to-analog (D/A) converter which converts the digital signal output from the comparator into an analog signal and feeds the analog signal back to the differential amplifier.

The band pass filter unit may include at least one band pass filter.

The sigma-delta A/D converter may further include a data weighted array (DWA) unit which corrects the digital signal output from the comparator to prevent an error from occurring in the D/A converter, and a delay compensator connected to the DWA unit, which receives the signal output from the DWA unit to compensate for a delay between the input signal and the feedback input signal and provides the signals to the D/A converter and the adder.

The band pass filter unit may include a first integrator and a second integrator which are connected to each other in series and integrate input signals respectively, a multiplier which adjusts a gain of the signal output from the second integrator by multiplying the signal by a predetermined coefficient, and an adder which adds the gain-adjusted signal fed back thereto to the input signal.

The comparator may cause quantization noise to occur during the process that the signal output from the adder is converted into a digital signal, and the quantization noise included in the signal output from the comparator may be divided into a first low frequency domain and a second high frequency domain at a predetermined frequency, and the number of notches formed in the first domain may increase in proportion to the number of band pass filters of the band pass filter unit.

As the number of band pass filters of the band pass filter unit increases, a corresponding notch may be formed in a low frequency direction in the first domain and a depth of the notch may gradually decrease.

Additional and/or other aspects and advantages of the invention will be set forth in part in the description which follows and, in part, will be obvious from the description, or may be learned by practice of the invention.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1:
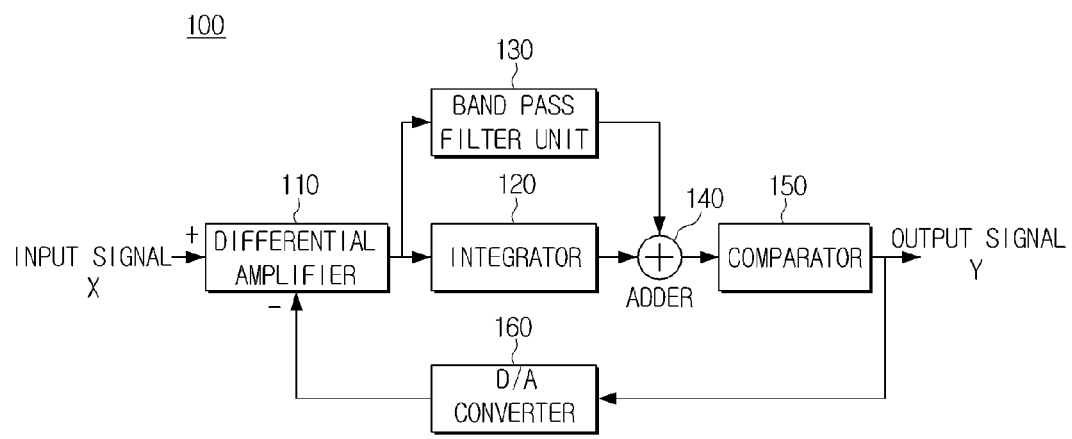
FIG. 1 is a block diagram of a sigma-delta modulator consistent with an exemplary embodiment of the present invention.

Certain exemplary embodiments of the present invention will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments of the present invention can be carried out without those specifically defined matters. Also, well-known functions or constructions are not described in detail since they would obscure the invention with unnecessary detail.

FIG. 1 is a block diagram of a sigma-delta modulator according to an exemplary embodiment of the present invention.

Referring to FIG. 1, the sigma-delta modulator 100 may include a differential amplifier 110, an integrator 120, a band pass filter unit 130, an adder 140, a comparator 150, and a D/A converter 160.

The differential amplifier 110 calculates a difference between an input analog signal and a feedback input analog signal. The sigma-delta modulator 100 according to an exemplary embodiment of the present invention adopts a loop type feedback configuration and thus the feedback input analog signal may include quantization noise which occurs in the comparator 150.

The integrator 120 integrates a signal calculated by the differential amplifier 110. The signal that has passed through the integrator 120 is output in the form of a signal having passed through a low pass filter with respect to an input signal component and in the form of a signal having passed through a high pass filter with respect to quantization noise. Accordingly, the integrator 120 may be realized as a low pass filter. In this case, the integrator 120 may be a third or higher order low pass filter. Ultimately, the integrator 120 separates a desired signal component from unnecessary quantization noise according to a frequency band.

The band pass filter unit 130 is connected to the integrator 120 in parallel and performs a band pass filtering with respect to the signal output from the differential amplifier 110. The band pass filter unit 130 may include at least one band pass filter.

The adder 140 adds the signal band-pass filtered by the band pass filter unit 130 and the signal integrated by the integrator 120.

The comparator 150 compares the signal output from the adder 140 with a predetermined reference value, converts the signal into a digital signal and outputs the digital signal. As described above, the comparator 150 quantizes the analog signal input thereto at predetermined intervals, extracts a sample value at predetermined intervals, and converts the sample value into a digital value. Accordingly, quantization noise may occur due to an error between the real analog value and the extracted digital value.

Also, the comparator 150 uses an oversampling technique that performs a sampling with a frequency over the Nyquist frequency. More specifically, the oversampling technique evenly distributes the quantization noise up to the oversampled frequency, thereby reducing average quantization noise although there is no change in a total amount of quantization noise (or electric power).

As a whole, if an analog sine wave is input as an example of an input signal X, a digital sequence such as 01110101 . . . may be output as an output signal Y.

The D/A converter 160 converts the digital signal output from the comparator 150 into an analog signal and feeds the analog signal back to the differential amplifier 110. For example, if a 2 bit (1 or 0) digital signal is output from the comparator 150, the D/A converter 160 converts the digital signal into an analog signal in a manner that it outputs "1" as Vref (=2.5V) and outputs "0" as −Vref (−2.5V).

Also, the sigma-delta modulator 100 according to an exemplary embodiment of the present invention may be embodied as a single chip integrating the above-described function units.

Figure 2:
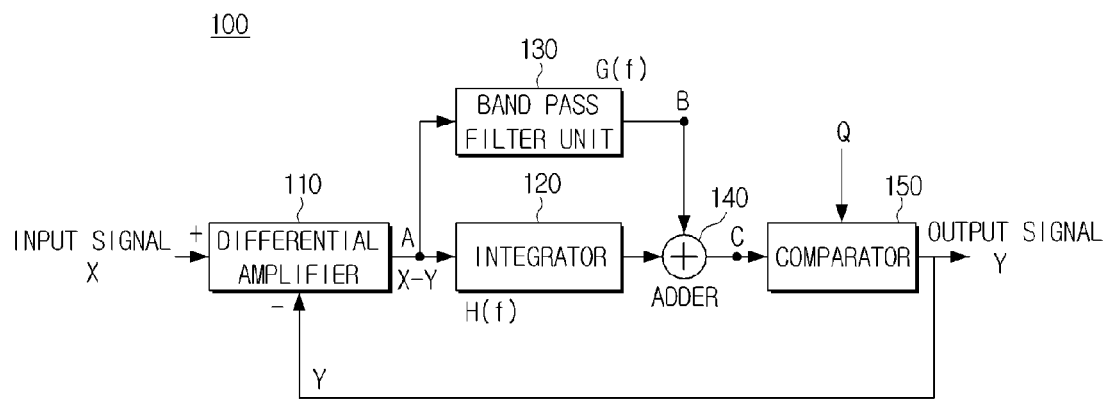
FIG. 2 is a block diagram to explain operation of the sigma-delta modulator of FIG. 1.

FIG. 2 is a block diagram to explain operation of the sigma-delta modulator of FIG. 1. The D/A converter 160 for converting a digital signal into an analog signal may be omitted for the sake of simple analysis in the frequency domain.

Referring to FIG. 2, the input signal X and the output signal Y pass through the differential amplifier 110 and are output as an X-Y signal at node A. Since the integrator 120 performs a low pass filtering with respect to the input signal, a transfer function equals to H (f)=1/f for example. In this embodiment, a first-order integrator is adopted for the sake of convenience of explanation but a third or higher order integrator 120 may be adopted.

Accordingly, the signal having passed through the integrator 120 is added with quantization noise in the comparator 150 and is expressed as follows in Equation 1:

$$Y = \frac{1}{f}(X - Y) + Q \qquad \text{[Equation 1]}$$

Equation 1 is re-expressed by the following Equation 2:

$$Y = \frac{X}{f+1} + \frac{Qf}{f+1} \qquad \text{[Equation 2]}$$

wherein the first term of the right hand side of equal sign denotes a desired signal component and the second term of the right hand side of equal sign denotes a unnecessary quantization noise component. Ultimately, with respect to a signal component, the final output (Y) is in the form of signal having passed through a low pass filter and, with respect quantization noise, the final output (Y) is in the form of signal having passed through a high pass filter.

More specifically, the final signal output after the signal having passed through the integrator 120 and the signal having passed through the band pass filter 130 are combined with each other in the adder 140 will be described in the S-plane below.

For example, if the transfer function H (S) of the integrator 120 equals to equation 3 and the transfer function G (S) of the band pass filter unit 130 equals to equation 4, the final signal output from the comparator 150 after the respective signals are combined with each other by the adder 140 and quantization noise Q is included by the comparator 150 is expressed by the following equation 5:

$$H(S) = \frac{1}{S} \qquad \text{[Equation 3]}$$

$$G(S) = \frac{1}{(1+S^2)} \qquad \text{[Equation 4]}$$

$$Y = \frac{S^2 + S + 1}{S^3 + S^2 + 2S + 1}X + \frac{S^3 + S}{S^3 + S^2 + 2S + 1}Q \qquad \text{[Equation 5]}$$

wherein, if the second term of the right hand side of equal sign for the quantization noise is analyzed, it can be seen that a notch is additionally formed in an existing quantization noise shape. Accordingly, the finally output quantization noise can be reduced.

Figure 3A:
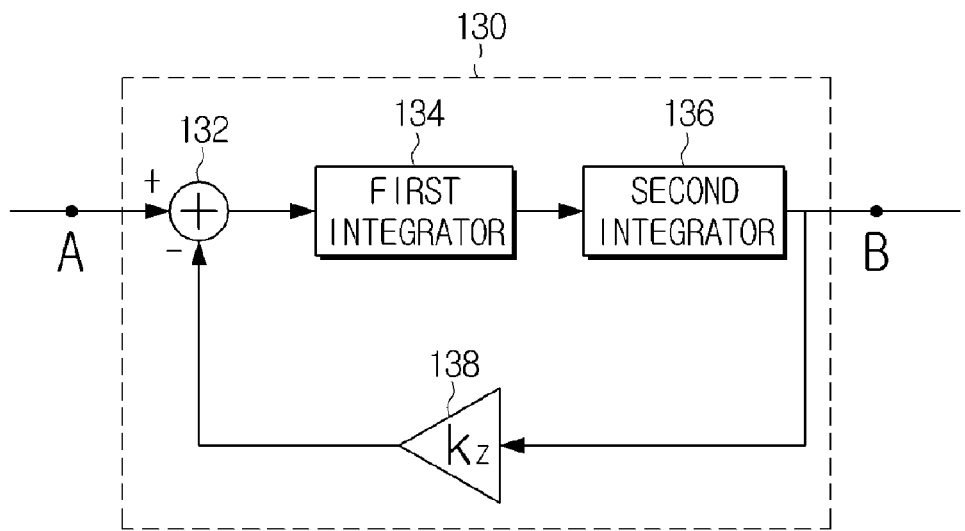
FIGS. 3A and 3B are block diagrams of a band pass filter unit consistent with an exemplary embodiment of the present invention.
Figure 3B:
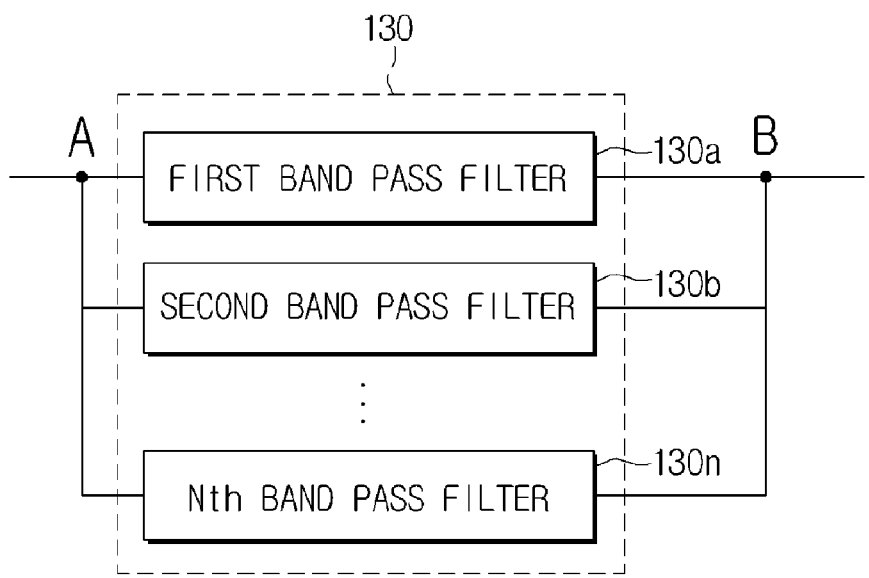

FIGS. 3A and 3B are block diagrams of the band pass filter unit consistent with an exemplary embodiment of the present invention.

Referring to FIG. 3A, the band pass filter unit 130 may include an adder 132, a first integrator 134, a second integrator 136, and a multiplier 138. The first integrator 134 and the second integrator 136 are connected to each other in series, and the multiplier 138 multiplies the signal output from the second integrator 136 by a predetermined coefficient, $k_2$, adjusting the gain of the signal. The gain-adjusted signal is fed back to the adder 132 to be added to a signal input from node A which is an output of the differential amplifier 110 (see FIGS. 1 and 2). In FIG. 3A, a second-order band pass filter using two integrators is used but it is obvious that band pass filters of various types can be applied.

Figure 7A:
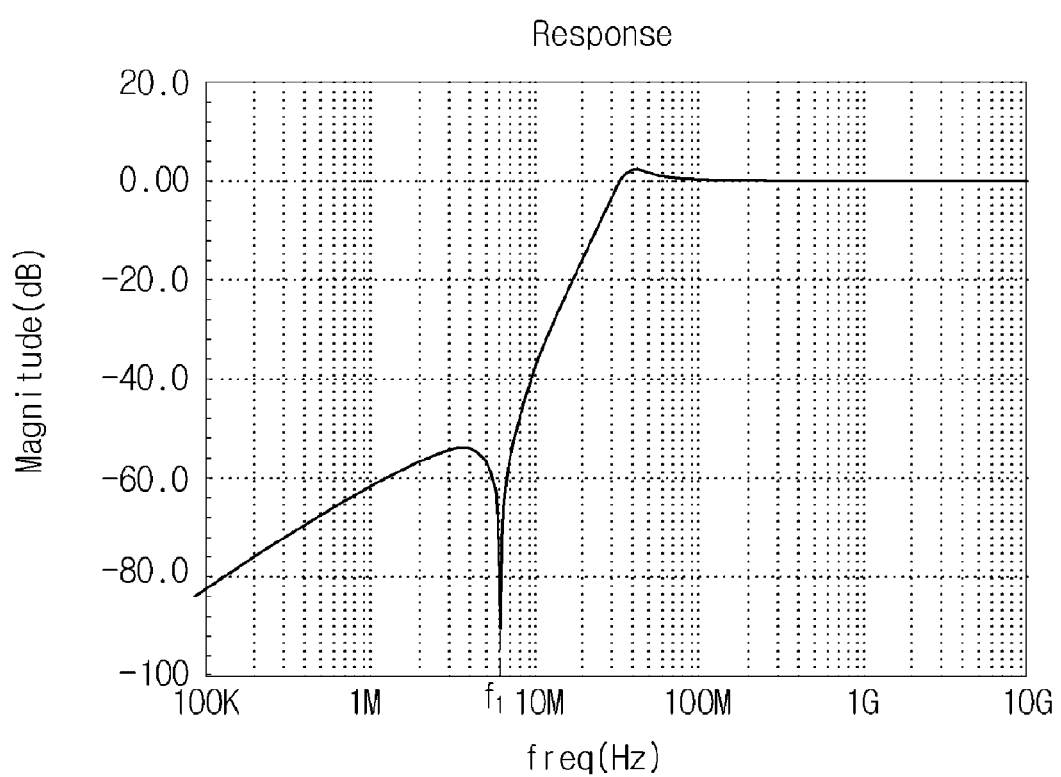
FIG. 7A is a graph showing a frequency response of quantization noise included in an output signal of a general sigma-delta modulator.
Figure 7B:
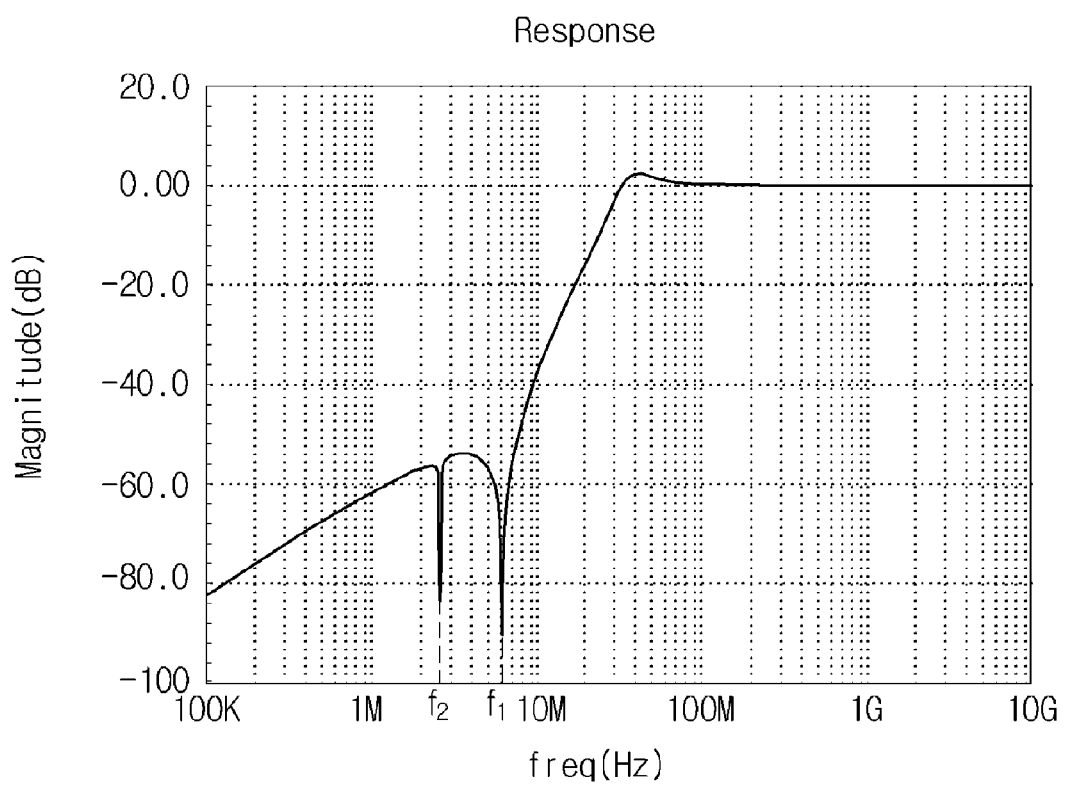
FIGS. 7B and 7C are graphs showing a frequency response of quantization noise included in an output signal of the sigma-delta modulator consistent with an exemplary embodiment of the present invention.
Figure 7C:
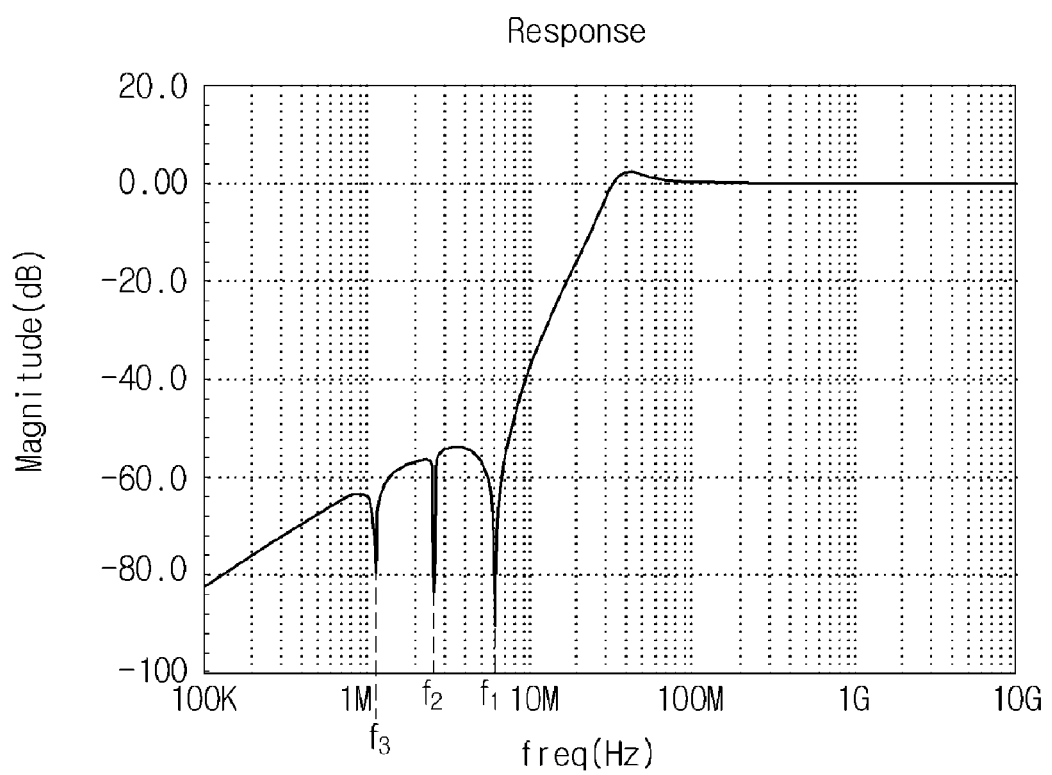

Referring to FIG. 3B, the band pass filter unit 130 may include 'n' band pass filters 130$a$, 130$b$, . . . 130$n$ which are connected to one another in parallel between the nodes A and B. Accordingly, as shown in FIGS. 7A to 7C, a plurality of notches is formed in the quantization noise and as a result the quantization noise is reduced. However, if several band pass filters are connected to one another, electric power is much consumed, so a proper trade-off between reduction in quantization noise and increase in power consumption is needed.

Figure 4:
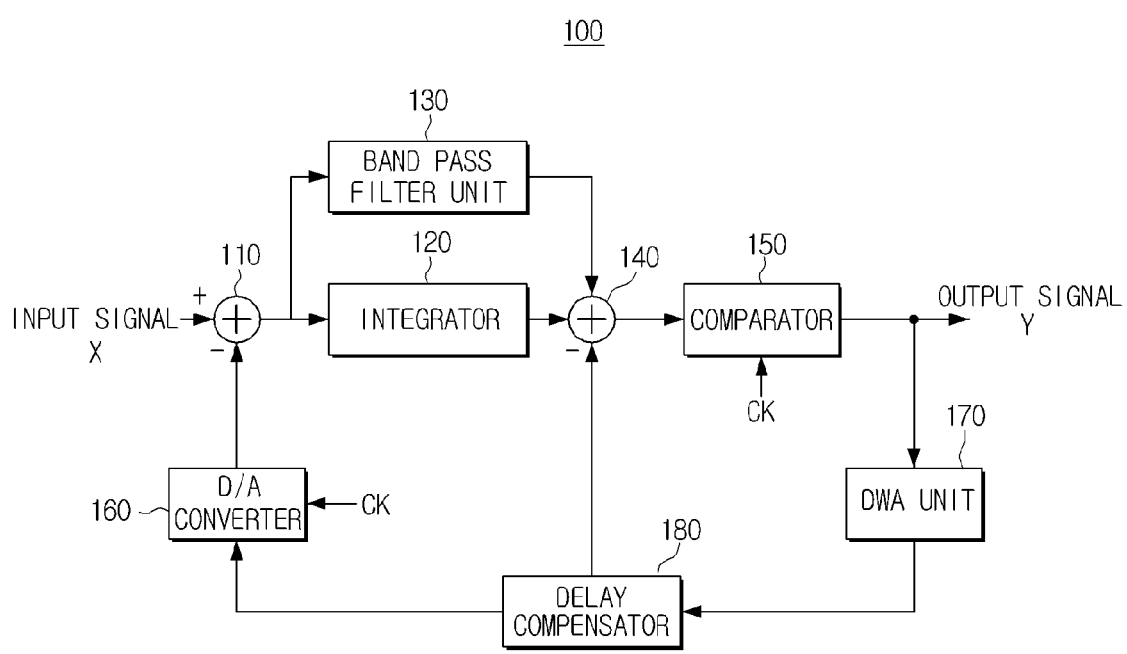
FIG. 4 is a detailed block diagram of the sigma-delta modulator of FIG. 1.

FIG. 4 is a detailed block diagram of the sigma-delta modulator of FIG. 1. FIG. 4 illustrates a data weighted array (DWA) unit 170 and a delay compensator 180 in addition to the units of the sigma-delta modulator shown in FIG. 1. The description of the same units as described in FIG. 1 will be omitted.

The DWA unit 170 corrects the digital signal output from the comparator 150 to prevent an error from occurring in the D/A converter 160. For example, the 4-bit comparator 150 may output 16 signals (or 15 signals; the number of signals is variable by a designer). The input analog signals are classified into 16 cells according to the sizes of the signals in a manner that a signal "0000" is classified into a cell mapped with "0", a signal "0001" is classified into a cell mapped "1", and so on. In this case, there may be an error due to unequal sizes (height) of the respective cells. Therefore, the DWA unit 170 randomizes this error to prevent spurious tones from occurring in the D/A converter 160.

The delay compensator 180 is connected to the DWA unit 170, and receives signals output from the DWA unit 170 to compensate for the delay between an input signal and a feedback input signal and provides the compensated signals to the D/A converter 160 and the adder 140.

Since the initial input signal X is in the form of an analog signal when passing through the integrator 120, the band pass filter unit 130, and the adder 140, a delay in time almost does not occur. However, when the signal passes through the comparator 150, a relatively long time delay may occur. For example, since the comparator 150 samples a signal at a rising edge and outputs a real output at a falling edge, a delay may occur between these time intervals. The delay compensator 180 compensates for the delay and provides the compensated signals to the D/A converter 160 and the adder 140.

Figure 5A:
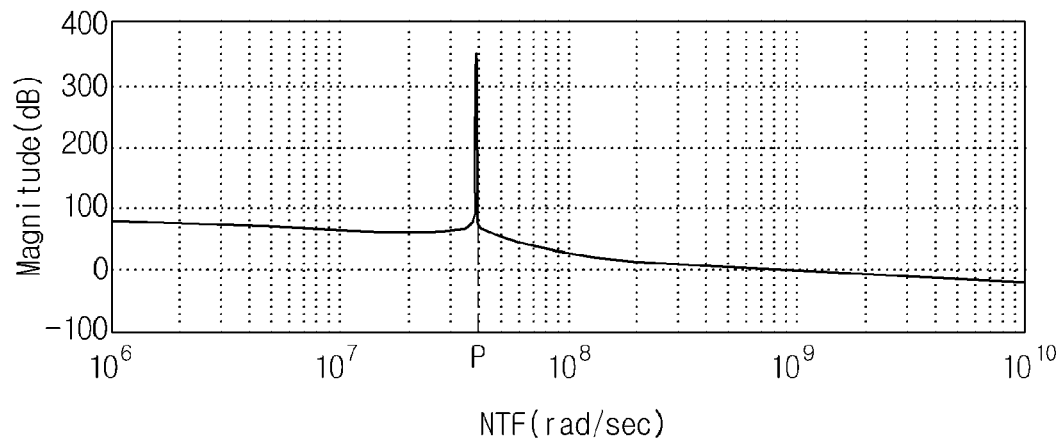
FIGS. 5A and 5B are bode plots showing a frequency characteristic and a phase characteristic of a noise transfer function (NTF) for quantization noise of a signal passing through an integrator of a general sigma-delta modulator.
Figure 5B:
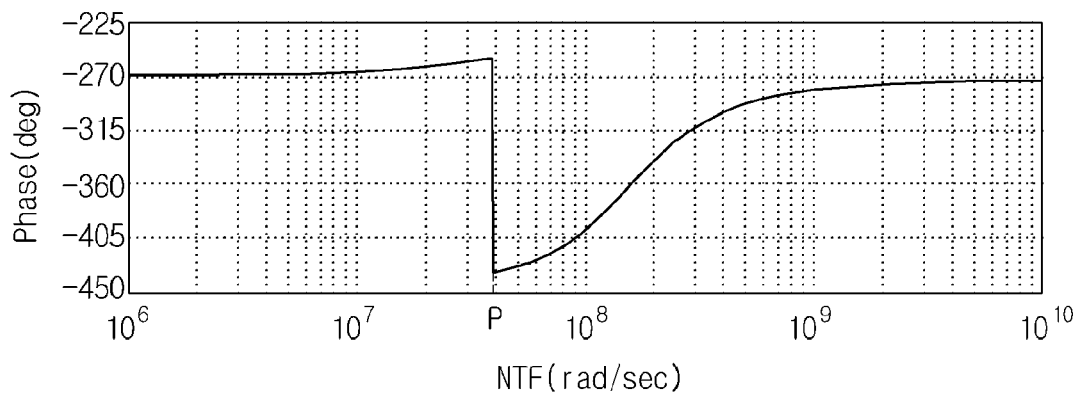
Figure 6A:
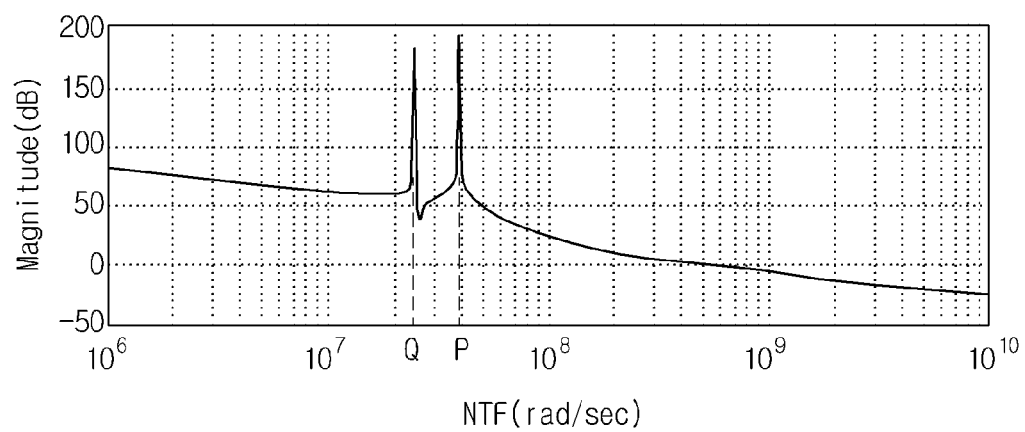
FIGS. 6A and 6B are bode plots showing a frequency and a phase response of a noise transfer function (NTF) for quantization noise of a signal passing through an adder of the sigma-delta modulator consistent with an exemplary embodiment of the present invention.
Figure 6B:
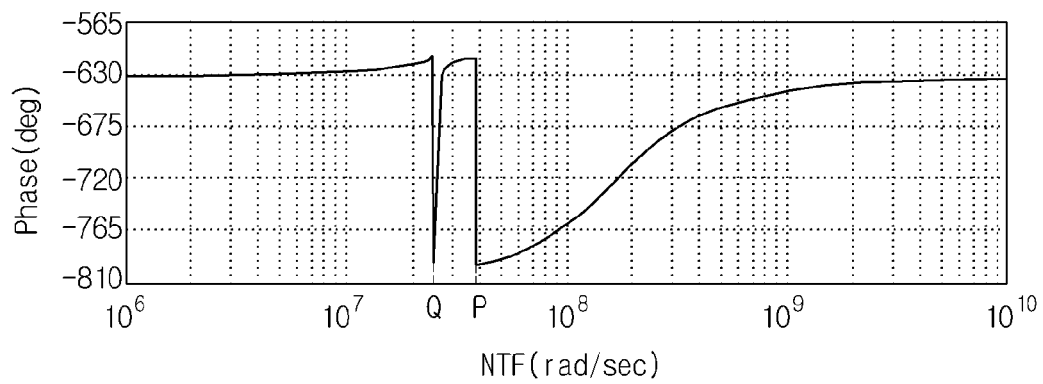

FIGS. 5A and 5B are bode plots showing a frequency characteristic and a phase characteristic of a noise transfer function (NTF) for quantization noise of a signal which has passed through an integrator of a general sigma-delta modulator. FIGS. 6A and 6B are bode plots showing a frequency characteristic and a phase characteristic of a noise transfer function (NTF) for quantization noise of a signal which has passed through the adder of the sigma-delta modulator according to an exemplary embodiment of the present invention.

Referring to FIG. 5A, a frequency characteristic of quantization noise output from an integrator 120 of a general sigma-delta modulator has a tendency to gradually decrease as a frequency increases. However, it can be seen that an impulse waveform is formed at a point P. Accordingly, as shown in FIG. 5B, the phase abruptly falls at the point P and then rises again.

On the other hand, referring to FIG. 6A, a frequency characteristic for quantization noise of a signal which has passed through the adder of the sigma-delta modulator according to an exemplary embodiment of the present invention has another impulse waveform at a point Q which is lower in frequency than the point P. Likewise, it can be seen from FIG. 6B that the phase characteristic abruptly falls at the point Q and then rises again. This feature is resulted from the configuration in which a single band pass filter of the band pass filter unit 120 is connected to the integrator 120 in parallel.

FIG. 7A is a graph showing a frequency response of quantization noise included in an output signal of a general sigma-delta modulator. Referring to FIG. 7A, the quantization noise included in the final output signal Y forms a first domain in the left hand side area (a low frequency domain) and a second domain in the right hand side area (a high frequency domain) with reference to a frequency $f_1$.

FIGS. 7B and 7C are views showing a frequency response of quantization noise included in an output signal of the sigma-delta modulator according to an exemplary embodiment of the present invention. Referring to FIG. 7B, it can be seen that a notch is formed at a frequency $f_2$ of the left hand side of the first domain (the low frequency domain) as described above. If a single band pass filter is connected in parallel in the band pass filter unit 130, a notch is formed at the frequency $f_2$ as shown in FIG. 7B so that quantization noise can be reduced. If two band pass filters are connected in parallel in the band pass filter unit 130, notches are formed at frequencies $f_2$ and $f_3$ respectively as shown in FIG. 7C so that quantization can be further reduced.

In this case, as the number of band pass filters included in the band pass filter unit 130 increases, notches are additionally formed in the direction toward the low frequency of the first domain and the depth of the notch gradually decreases.

That is, at least one notch is formed in the first domain of the quantization noise so that quantization noise can be reduced. Also, a desired signal is located in the first domain and quantization noise in the first domain is reduced so that the desired signal can be easily separated from unnecessary quantization noise.

Figure 8:
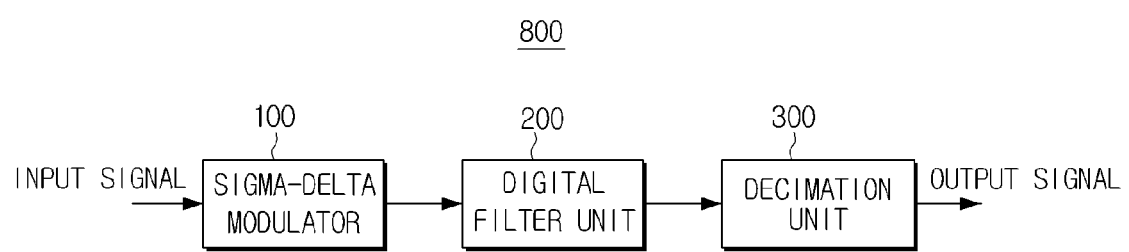
FIG. 8 is a block diagram of a sigma-delta A/D converter consistent with an exemplary embodiment of the present invention.

FIG. 8 is a block diagram of a sigma-delta A/D converter according to an exemplary embodiment of the present invention. Referring to FIG. 8, a sigma-delta A/D converter 800 according to an exemplary embodiment of the present invention may include a sigma-delta modulator 100, a digital filter unit 200, and a decimation unit 300.

Since the sigma-delta modulator 100 is the same as the sigma-delta modulator described above, description thereof will be omitted.

The digital filter unit 200 filters only a desired signal component coexisting with quantization noise in the above-described first domain. Accordingly, the digital filter unit 200 may be realized as a low pass filter.

Also, the decimation unit 300 decimates the signal oversampled by the comparator 150 of the sigma-delta modulator 100 to an original frequency band before oversampling. That is, the signal is decimated at the same ratio as the oversampling ratio of the comparator 150.

Accordingly, the sigma-delta A/D converter 800 can reduce an average quantization noise floor.

Also, the sigma-delta A/D converter 800 according to an exemplary embodiment of the present invention may be realized as a single chip integrating the above-described function units.

According to various exemplary embodiments of the present invention, the average quantization noise floor is reduced by performing a band pass filtering.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A sigma-delta modulator comprising:
a differential amplifier which outputs a difference signal indicating a difference between an input analog signal and a feedback input analog signal;
an integrator which integrates the difference signal;
a band pass filter unit connected to the integrator in parallel which performs band pass filtering with respect to the difference signal;
an adder which adds the band-pass filtered signal to the integrated signal;
a comparator which compares a signal output from the adder with a predetermined reference value, converts the comparison result into a digital signal, and outputs the digital signal;
a digital-to-analog (D/A) converter which converts the digital signal output from the comparator into an analog signal and feeds the analog signal back to the differential amplifier;
a data weighted array (DWA) unit which corrects the digital signal output from the comparator to prevent an error from occurring in the D/A converter; and
a delay compensator connected to the DWA unit, which receives the signal output from the DWA unit to compensate for a delay between the input signal and the feedback input signal and provides the compensated signals to the D/A converter and the adder.

2. A sigma-delta modulator comprising:
a differential amplifier which outputs a difference signal indicating a difference between an input analog signal and a feedback input analog signal;
an integrator which integrates the difference signal;
a band pass filter unit connected to the integrator in parallel which performs band pass filtering with respect to the difference signal;
an adder which adds the band-pass filtered signal to the integrated signal;
a comparator which compares a signal output from the adder with a predetermined reference value, converts the comparison result into a digital signal, and outputs the digital signal; and
a digital-to-analog (D/A) converter which converts the digital signal output from the comparator into an analog signal and feeds the analog signal back to the differential amplifier,
wherein the band pass filter unit comprises:
a first integrator and a second integrator which are connected to each other in series and integrate input signals respectively;
a multiplier which adjusts a gain of the signal output from the second integrator by multiplying the signal by a predetermined coefficient; and
an adder which adds the gain-adjusted signal fed back thereto to the input signal.

3. A sigma-delta modulator comprising:
a differential amplifier which outputs a difference signal indicating a difference between an input analog signal and a feedback input analog signal;
an integrator which integrates the difference signal;
a band pass filter unit connected to the integrator in parallel which performs band pass filtering with respect to the difference signal;
an adder which adds the band-pass filtered signal to the integrated signal;
a comparator which compares a signal output from the adder with a predetermined reference value, converts the comparison result into a digital signal, and outputs the digital signal; and
a digital-to-analog (D/A) converter which converts the digital signal output from the comparator into an analog signal and feeds the analog signal back to the differential amplifier,
wherein quantization noise included in the signal output from the comparator is divided into a first low frequency domain and a second high frequency domain at a predetermined frequency, and the number of notches formed in the first domain increases in proportion to the number of band pass filters of the band pass filter unit.

4. The sigma-delta modulator as claimed in claim 3, wherein as a number of band pass filters of the band pass filter unit increases, a corresponding notch is formed in a low frequency direction in the first domain and a depth of the notch gradually decreases.

5. A sigma-delta analog-to-digital (A/D) converter comprising:
a sigma-delta modulator;
a digital filter; and
a decimation filter,
wherein the sigma-delta modulator comprises:
 a differential amplifier which outputs a difference signal indicating a difference between an input analog signal and a feedback input analog signal, an integrator which integrates the calculated signal;
 a band pass filter unit connected to the integrator in parallel which performs a band pass filtering with respect to the difference signal;
 an adder which adds the band-pass-filtered signal to the integrated signal;
 a comparator which compares the signal output from the adder with a predetermined reference value and converts the comparison result into a digital signal; and
 a digital-to-analog (D/A) converter which converts the digital signal output from the comparator into an analog signal and feeds the analog signal back to the differential amplifier.

6. The sigma-delta A/D converter as claimed in claim 5, wherein the band pass filter unit comprises at least one band pass filter.

7. The sigma-delta A/D converter as claimed in claim 5, further comprising:
a data weighted array (DWA) unit which corrects the digital signal output from the comparator to prevent an error from occurring in the D/A converter; and
a delay compensator connected to the DWA unit, which receives the signal output from the DWA unit to compensate for a delay between the input signal and the feedback input signal and provides the signals to the D/A converter and the adder.

8. The sigma-delta A/D converter as claimed in claim 5, wherein the band pass filter unit comprises:
a first integrator and a second integrator which are connected to each other in series and integrate input signals respectively;
a multiplier which adjusts a gain of the signal output from the second integrator by multiplying the signal by a predetermined coefficient; and
an adder which adds the gain-adjusted signal fed back thereto to the input signal.

9. The sigma-delta A/D converter as claimed in claim 5, wherein quantization noise included in the signal output from the comparator is divided into a first low frequency domain and a second high frequency domain at a predetermined frequency, and the number of notches formed in the first domain increases in proportion to the number of band pass filters of the band pass filter unit.

10. The sigma-delta D/A converter as claimed in claim 9, wherein as a number of band pass filters of the band pass filter unit increases, a corresponding notch is formed in a low frequency direction in the first domain and a depth of the notch gradually decreases.

* * * * *